(12) United States Patent
Shinohara et al.

(10) Patent No.: US 6,261,856 B1
(45) Date of Patent: *Jul. 17, 2001

(54) METHOD AND SYSTEM OF LASER PROCESSING

(75) Inventors: Hisato Shinohara, Sagamihara; Akira Sugawara, Atsugi, both of (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,751

(22) Filed: Dec. 10, 1998

Related U.S. Application Data (60) Division of application No. 08/169,127, filed on Dec. 20, 1993, which is a continuation-in-part of application No. 07/891,907, filed on Jun. 1, 1992, now abandoned, which is a continuation of application No. 07/626,419, filed on Dec. 14, 1990, now abandoned, which is a continuation of application No. 07/288,186, filed on Dec. 22, 1988, now abandoned, which is a continuation of application No. 07/097,190, filed on Sep. 16, 1987, now Pat. No. 4,861,964.

(30) Foreign Application Priority Data

Dec. 23, 1987 (JP) .................................................. 62-327663

(51) Int. Cl.⁷ .............................. H01L 21/00; H01L 21/46
(52) U.S. Cl. .......................... 438/30; 438/166; 438/463; 438/487
(58) Field of Search ............................. 438/30, 166, 487, 438/463, 662, 776, 795, 479, 799

(56) References Cited

U.S. PATENT DOCUMENTS

| | | |
|---|---|---|
| Re. 33,947 | 6/1992 | Shinohara . |
| 3,848,104 | 11/1974 | Locke ................................ 219/121.8 |
| 3,877,777 | 4/1975 | Glenn, Jr. ............................. 359/202 |
| 4,059,461 | 11/1977 | Fan et al. . |
| 4,154,530 | 5/1979 | Connolly, Jr. et al. ......... 219/121.82 |
| 4,181,563 | 1/1980 | Miyaka et al. ...................... 427/53.1 |
| 4,233,626 | 11/1980 | Bell . |

(List continued on next page.)

FOREIGN PATENT DOCUMENTS

| | | | |
|---|---|---|---|
| 28 12 868 A1 | 10/1978 | (DE) . | |
| 3407089 A1 | 8/1985 | (DE) ..................................... 427/582 |

(List continued on next page.)

OTHER PUBLICATIONS

A. Misura et al., "High–Performance Low–Temperture Poly Sy TFT's for LCD", 1987, IEEE, pp. 87–439 No Month Given.

(List continued on next page.)

Primary Examiner—Vu A. Le
Assistant Examiner—Michael S. Lebentritt
(74) Attorney, Agent, or Firm—Eric J. Robinson; Nixon Peabody LLP (57) ABSTRACT

A method for treating an object with a laser including emitting a laser beam from a laser; expanding the laser beam in a first direction; removing a portion of the laser beam though a mask, the portion including at least edges of the expanded laser beam extending in the first direction; and condensing the laser beam in a second direction orthogonal to the first direction in order to form a line-shaped laser beam on an object.

40 Claims, 8 Drawing Sheets

U.S. PATENT DOCUMENTS

| | | |
|---|---|---|
| 4,270,132 | 5/1981 | Bell . |
| 4,292,092 | 9/1981 | Hanak .................................. 427/53.1 |
| 4,309,225 | 1/1982 | Fan et al. . |
| 4,314,256 | 2/1982 | Petrov et al. . |
| 4,341,569 | 7/1982 | Yaron et al. ............................ 148/1.5 |
| 4,358,659 | 11/1982 | Sponheimer ..................... 219/121.68 |
| 4,370,175 | 1/1983 | Levatter . |
| 4,413,020 | 11/1983 | McKee et al. ........................ 427/53.1 |
| 4,444,801 | 4/1984 | Hongo et al. .......................... 427/555 |
| 4,468,551 | 8/1984 | Neiheisel ......................... 219/121.75 |
| 4,473,433 | 9/1984 | Bosch et al. ........................... 427/555 |
| 4,543,464 | 9/1985 | Takeuchi .......................... 219/121.82 |
| 4,568,409 | 2/1986 | Caplan . |
| 4,680,855 | 7/1987 | Yamazaki et al. .................... 156/643 |
| 4,713,518 | 12/1987 | Yamazaki et al. ................... 427/53.1 |
| 4,727,234 | 2/1988 | Oprysko et al. ....................... 427/555 |
| 4,753,855 | 6/1988 | Haluska et al. ......................... 427/58 |
| 4,753,856 | 6/1988 | Haluska et al. ...................... 427/53.1 |
| 4,784,963 | 11/1988 | Krimmel et al. ..................... 427/585 |
| 4,786,358 | 11/1988 | Yamazaki et al. .................... 156/643 |
| 4,861,964 | 8/1989 | Sinohara . |
| 4,874,920 | 10/1989 | Yamazaki et al. . |
| 4,915,981 | 4/1990 | Traskos et al. ....................... 427/584 |
| 4,937,129 | * 6/1990 | Yamazaki ............................. 428/195 |
| 4,970,368 | 11/1990 | Yamazaki et al. . |
| 4,970,369 | 11/1990 | Yamazaki et al. . |
| 5,084,300 | 1/1992 | Zander et al. ........................ 427/584 |
| 5,112,645 | 5/1992 | Sekine et al. ......................... 427/583 |
| 5,306,651 | 4/1994 | Masumo et al. . |
| 5,320,984 | 6/1994 | Zhang et al. . |
| 5,432,122 | 7/1995 | Chae . |
| 5,453,858 | 9/1995 | Yamazaki . |
| 5,656,826 | 8/1997 | Misawa et al. . |
| 5,708,252 | 1/1998 | Shinohara et al. .............. 219/121.73 |
| 5,897,799 | * 4/1999 | Yamazaki ............................. 438/463 |
| 6,002,101 | * 12/1999 | Yamazaki et al. .............. 219/121.75 |

FOREIGN PATENT DOCUMENTS

| | | | |
|---|---|---|---|
| 3 925 085 C1 | 1/1991 | (DE) . | |
| 3925085 C1 | 1/1991 | (DE) ..................................... 427/584 |
| 0 209 131 | 1/1987 | (EP) ..................................... 427/582 |
| 53-122403 | 10/1978 | (JP) . |
| 55-32026 | 3/1980 | (JP) . |
| 57-79914 | 5/1982 | (JP) . |
| 57-94482 | 6/1982 | (JP) . |
| 57-158623 | 9/1982 | (JP) . |
| 57-193291 | 11/1982 | (JP) . |
| 59-108357 | 6/1984 | (JP) . |
| 60-052390 | 3/1985 | (JP) . |
| 60-216549 | 10/1985 | (JP) ..................................... 427/583 |
| 60-224282 | 11/1985 | (JP) . |
| 60-227484 | 11/1985 | (JP) . |
| 60-245124 | 12/1985 | (JP) . |
| 60-257511 | 12/1985 | (JP) . |
| 60-260393 | 12/1985 | (JP) . |
| 61-031288 | 2/1986 | (JP) . |
| 61-31288 | 2/1986 | (JP) . |
| 61-72549 | 4/1986 | (JP) . |
| 61-80815 | 4/1986 | (JP) . |
| 61-89636 | 5/1986 | (JP) . |
| 61-141174 | 6/1986 | (JP) . |
| 61-216449 | 9/1986 | (JP) ..................................... 427/582 |
| 61-276233 | 12/1986 | (JP) ..................................... 427/582 |
| 62-143847 | 6/1987 | (JP) . |
| 63-25933 | 2/1988 | (JP) . |
| 63-084789 | 4/1988 | (JP) . |
| 63-195148 | 8/1988 | (JP) . |
| 63-195149 | 8/1988 | (JP) . |
| 1-136973 | 5/1989 | (JP) ..................................... 427/583 |
| 1-241862 | 9/1989 | (JP) . |
| 2-50963 | 2/1990 | (JP) ..................................... 427/555 |
| 2-67721 | 3/1990 | (JP) ..................................... 427/583 |
| 60-52390 | 3/1990 | (JP) . |
| 2-174123 | 7/1990 | (JP) ..................................... 427/583 |
| 2-222154 | 9/1990 | (JP) . |
| 3-24259 | 2/1991 | (JP) ..................................... 427/583 |
| 4-338631 | 11/1992 | (JP) . |
| 5-21339 | 1/1993 | (JP) . |

OTHER PUBLICATIONS

E. Fujii et al., "A 10 MHz Intergrated Drive for Active–Matrix LCDs Laser–Recrystallizd Silicon TFTs", 1987, IEEE, pp. 448–IEDM 87–IEDM 87–451 No Month Given.

McGrath, "Applications of Excimer Lasers in Microelectronics", Solid State Technology, Dec. 1983, pp. 165–169.

Sera et al., "High Performance TFT's Fabricated by XeCI Excimer Laser Annealing of Hydrogenated Amorphous––Silicon Film", IEEE Transactions on Electron Devices, vol. 36, No. 12, Dec. 1989, pp. 2868–2872.

Sameshima et al., "XeCI Excimer Laser Annealing Used to Fabricate Poly–Si TFTs", Japanese Journal of Applied Physics, vol. 28, No. 10, Oct. 1989, pp. 1789–1793.

Morikawa et al., "Special Article: Present Situation of Laser Processing Technique Application of Surface Modification by $CO_2$ Laser", Sep. 1990 (with English translation).

Kaneko, "VI. Excimer Laser Annealed Poly–Crystalline Silicon TFT", T. IEE Japan, vol. 110–A, No. 10, (1990), pp. 679–683 (with English translation) No Month Given.

Semiconductor World, "Excimer Laser Annealing Apparatus", Oct. 1, 1992, pp. 196–197 (with English Translation).

Palmer, C. Harvey, "Optics: Experiments and Demonstrations," The Johns Hopkins Press, pp. 10–11, 1962 No Month Given.

Gladstone et al., "Liquid Crystal Display Device Configuration", IBM Technical Disclosure Bulletin, vol. 15, No. 2, Jul. 1972, pp. 437–438.

Bahadur, "Molecular Crystals and Liquid Crystals", vol. 109, No. 1, New York, (1984), pp. 24–26 Month Unknown.

"Optical System for Laser Machining of Narrow Slots", by Grimm, IBM Technical Disclosure Bulletin, vol. 14, No. 9, pp. 2641–2642, Feb. 1972.

* cited by examiner

METHOD AND SYSTEM OF LASER PROCESSING

RELATED APPLICATIONS

This application is a divisional application of Ser. No. 08/169,127, filed Dec. 20, 1993; which itself is a continuation-in-part of Ser. No. 07/891,907, filed Jun. 1, 1992, abandoned; which is a continuation of Ser. No. 07/626,419, filed Dec. 14, 1990, abandoned; which is a continuation of Ser. No. 07/288,186, filed Dec. 22, 1988, abandoned; which is a continuation of Ser. No. 07/097,190, filed Sep. 16, 1987 (now U.S. Pat. No. 4,861,964).

BACKGROUND OF THE INVENTION

The present invention relates to a method of producing thin film patterns on a glass substrate.

Photolithography is a well-known technique for producing patterns in thin films formed on substrates. This technique is convenient and advantageous, having regard to the desirability of removing portions of the thin film to be processed without causing damage to the underlying surface. However, a somewhat large number of steps is necessary for completing patterning procedure in accordance with this method. Namely, after forming the thin film to be treated on a substrate, a photoresist film is formed and patterned; the thin film is subjected to an etchant through the patterned photoresist film as a mask and then the photoresist film is removed.

Laser scribing techniques are well known in the art as a low cost patterning method capable of carrying out the scribing at a high speed. YAG laser (IR light, 1.06 microns) is a representative laser which has been generally used for this purpose. Since the optical energy of this laser is only 1.23 eV, however, tin oxide, indium oxide (or ITO), ZnO or so forth having optical energy gaps of about 3 to 4 eV are not effectively processed by the YAG laser. While transparent conductive oxide (CTO) films are generally made of this class.

This laser scribing method has another shortcoming. When portions of a transparent conductive film formed over a soda-lime glass substrate with an ion blocking film therebetween is removed in order to produce electrode patterns thereon, the ion blocking film and the glass substrate are partially eliminated together, and therefore the surface of the glass substrate is exposed. Eventually, in case of liquid crystal device manufacture, the liquid crystal material contained in the device is contaminated by sodium ions introduced from the glass substrate. Furthermore, the scribing makes the upper surface thereof uneven as well as residue remaining on the edges of the removal portions, the residue is piled as high as 0.5 to 1 micron. The unevenness is undesirable not only in regard to the application to liquid crystal devices but also to the manufacture of general electric devices including laminating process. The uneven surface might may be the cause of electrical shorting between different levels of the laminate and disconnection of the electrical patterns superimposed thereon.

SUMMARY OF THE INVENTION

It is an object of the present invention to provide a thin film pattern formed on a glass substrate in order that little contaminant is leaked from the substrate.

In accordance with a preferred embodiment, a glass substrate is covered with an alkali ion blocking film made of silicon oxide by sputtering, followed by forming an ITO (indium tin oxide) film. The ITO film is then treated by laser scribing in order to produce a pattern of the ITO film. In this connection, there are several key points for improving the configuration of the pattern as follow.

The heat transmission is an obstacle to the formation of clear edges of grooves. While laser irradiated portions are heated to its boiling point, the adjacent portions are necessarily heated, reflow and form swollen edges adjacent to the grooves. In order to minimize the formation of the swollen portions which cause disconnection of an overlying film coated thereon, it is necessary to elevate the temperature of the portions to be removed to the boiling point in advance of substantially heating the adjacent portions of the ITO film. This is accomplished by making use of a laser beam having a short wavelength and a short pulse width. The wavelength is selected to be not longer than 400 nm (3.1 eV). The pulse length is not longer than 50 nanoseconds. YAG lasers, which have been broadly used in the field, can not emit such a power concentrated laser pulse. The applicant found that eximer lasers could be used for this purpose. In this regards, the damage of the ion blocking film during laser scribing largely depends on the thermal conductivity thereof. As the thermal conductivity is low, the elevation speed of the ion blocking film becomes low and suffers little influence of heat from the overlying ITO film.

The melting points of the ion blocking film and the ITO film are very important. If the ion blocking film is easily molten, there is a chance that openings is formed in the blocking film so that the glass surface is exposed through the grooves. In this regards, the choice of ITO and non-doped $SiO_2$ is desirable since the melting points of the former and the latter are 890° C. and 1700° C. respectively. The melting point of the $SiO_2$ film is in turn substantially higher than that of the glass substrate. The energy gaps of them are also suitable for this purpose. SiO has an energy gap of 7 to 8 eV and therefore absorbs little portion of the eximer laser beam of a short wavelength, while ITO has an energy gap of 3 eV.

The method in which only the ITO film is selectively removed by the laser scribing is advantageous having regards to the desirability of smooth and level surface of patterns. Even in accordance with the present invention, residue remains after removal of the ITO film. The residue, however, can be easily eliminated by HCl etch since it is composed of $InO_x$ and $SnO_x$ of porous structure. Unlike this, in accordance with prior art methods utilizing YAG lasers in which the $SiO_2$ film is eventually partially removed, the residue is formed somewhat integrally with the remaining portions of the ITO and composed of an indium or tin alloy which is mixed with silicon contained in the underlying ion blocking film. The residue can not be eliminated by HCl etch and requires HF etch. Even if HF etch is used, the residue can not be selectively removed independent of the remaining portion of ITO film, which tends to be partially removed together with the overlying ITO film by HF etch.

The ion blocking film is not limited to $SiO_2$ film formed by sputtering but may be made from other materials as long as the above listed conditions are satisfied. For example, the blocking film can be formed by CVD of $SiO_2$ or $Si_3N_4$ films, sputtering of a target of heat resistant glass, such as quartz. Anyway, the formation should be carried out under the softing temperature of the glass substrate.

DETAILED DESCRIPTION OF THE PREFERRED EMBODIMENTS

Figure 1:
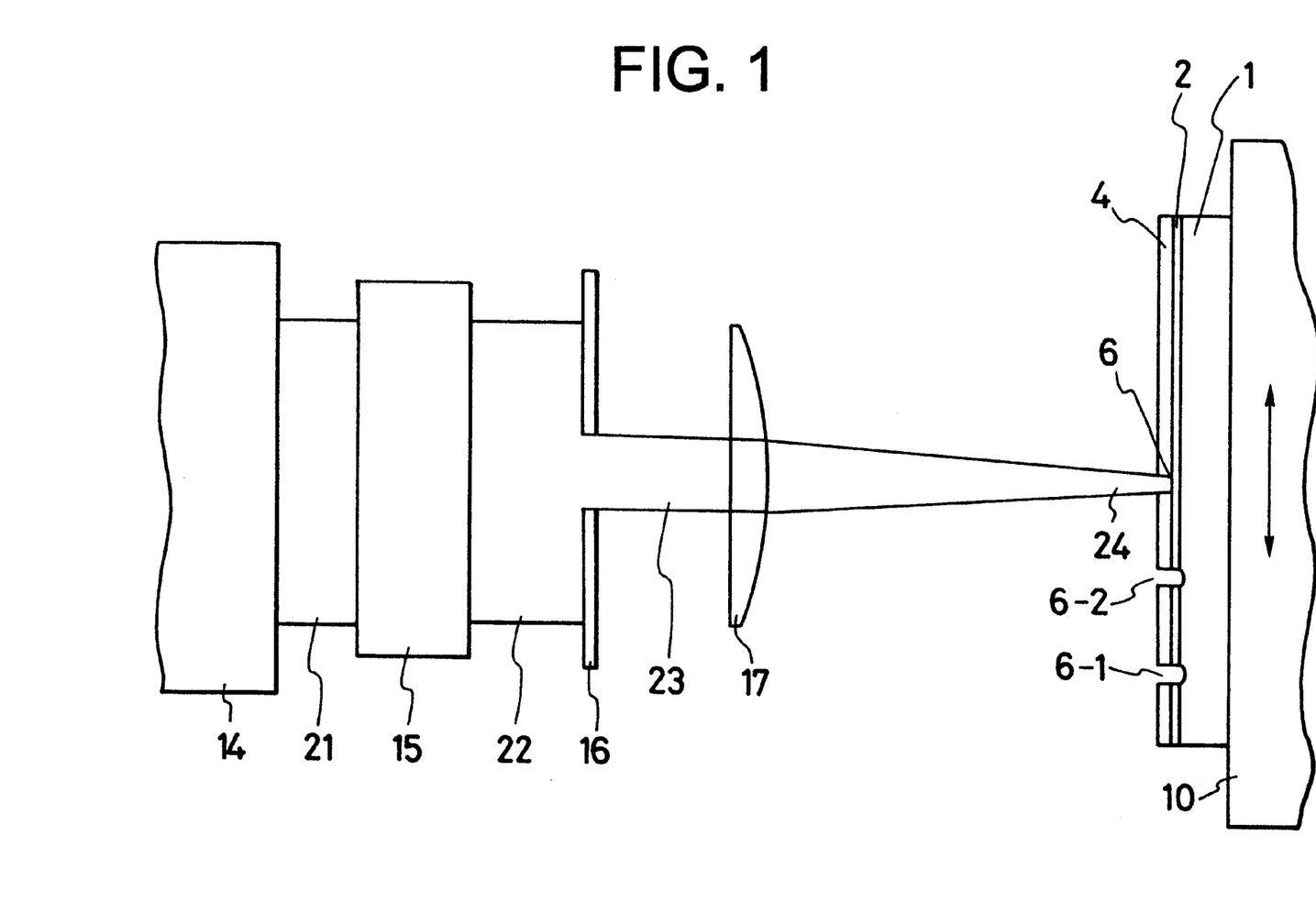
FIG. 1 is a schematic diagram showing a laser scribing assembly for laser patterning in accordance with the present invention.

Referring now to FIG. 1, a laser scribing assembly is shown in accordance with the present invention. The laser assembly is comprised of a KrF eximer laser 14 (wavelength=248 nm, Eg=5.0 eV, efficient=3%, output energy =350 mJ), a beam expander 15, a mask 16, a convex cylindrical lens 17 made of synthetic quartz and a substrate holder 10. The substrate holder 10 is adapted to slide in the vertical direction as viewed in the illustration in order to change the position of a soda-lime glass substrate 1 mounted thereon. Formed on the substrate 1 are an ion blocking film 2 of 50 to 1500 Å, e.g, 200 Å thickness made of silicon oxide containing very little amount of impurity ions such as phosphorus, sodium and boron ions, and a transparent conductive film of 1000 to 3000 Å thickness made of ITO, tin oxide, zinc oxide or a laminate thereof. The transparent conductive film 4 may be provided with a chromium or molybdenum thin film coating thereon. Depending on the case, an insulating or semiconductor film may be formed under or over the conductive film if necessary.

Figure 2A:
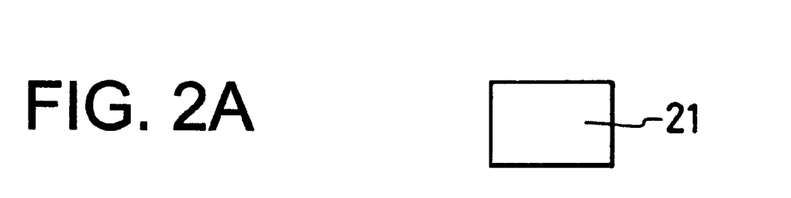
FIGS. 2(A) to 2(D) are explanatory views showing the shaping process of a laser beam in cross section in accordance with the present invention.
Figure 2B:
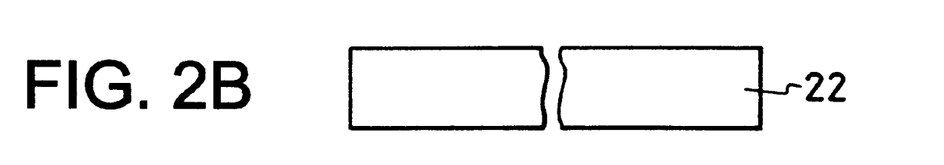
Figure 2C:
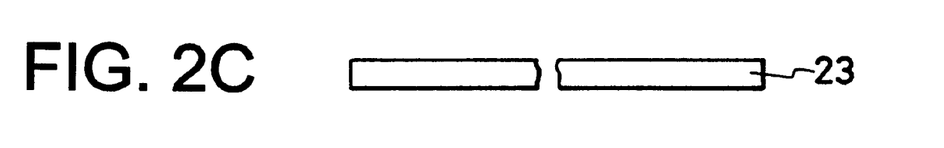
Figure 2D:
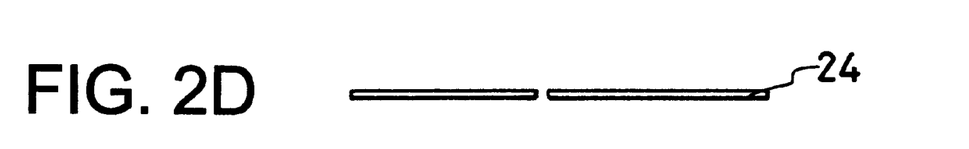

The height and width of the laser beam after emitted from the eximer laser 14 are 16 mm and 20 mm as illustrated in FIG. 2(A). This laser beam 21 is expanded to have a width of 300 mm as illustrated in FIG. 2(B), while its height remains not changed, by means of the beam expander 15. After expanded, the energy density becomes $5.6 \times 10^{-2}$ mJ/mm$^2$. The expanded beam 22 is then deprived of its periphery by means of the mask 16 in order to have a height of 2 mm as illustrated in FIG. 2(C). The removal of the peripheral portion of the expanded laser beam is carried out for the purpose of reducing the aberration effect by the subsequent cylindrical lens 17. The flat laser beam 13 is contracted and focussed on the surface of the substrate 1 by means of the lens 17 as illustrated in FIG. 1 and FIG. 2(D). The height of the laser beam at the surface of the substrate 1 is 10 microns. In practice, the grooves to be formed on the substrate may have widths ranging from 2 microns to 200 microns, e.g. 50 microns, 20 microns, 10 microns, 5 microns and 3 microns, depending upon the applications.

Figure 3A:
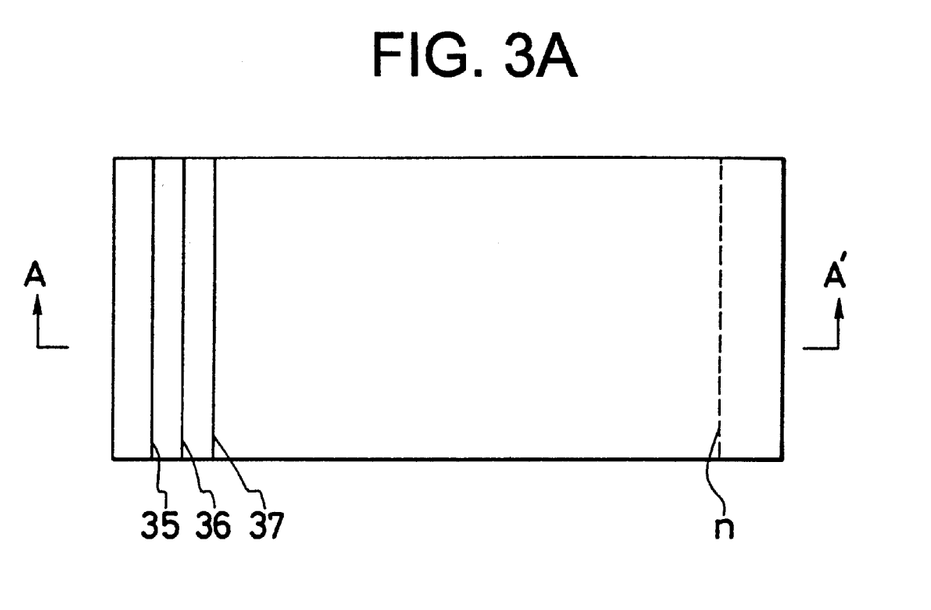
FIGS. 3(A) to 3(B) are plan and cross sectional views showing the fabricating process of a thin film pattern in accordance with the present invention.
Figure 3B:
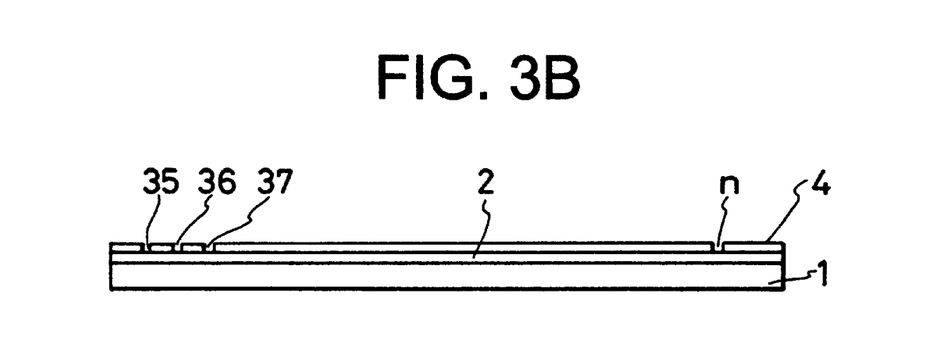

The laser beam is repeatedly projected on the substrate 1 in the form of pulses while the substrate is slided respective to the laser beam. The pulse duration is 20 namo seconds and the frequency is 1–100 Hz, for example 10 Hz. Then grooves 35, 36, 37, . . . are formed as illustrated in FIG. 3(A) and 3(B). The distance between adjacent ones of the grooves is 15 mm. Residue is left around and inside of the grooves. The residue is selectively removed by an acid, for example, a hydrochloric or hydrofluoric acid (diluted by water at 1/10) or a fluoride solution mixture such as an acidic ammonia fluoride, followed by ultrasonic cleaning (29 KHz) with acetone and pure water.

If the present invention is applied to the manufacture of liquid crystal devices, liquid crystal material, of which high purity is required, is effectively prevented from being contaminated by sodium ions which otherwise would escape from the soda-lime substrate when subjected to long time use. Also, if it is used as the substrate for image sensors, solar cells and the like, amorphous semiconductor films are protected from influence of sodium ions, which tend to result in the degradation of photoelectric conversion ability and the modification of the semiconductor n-type semiconductor.

The ion blocking film is formed by any known techniques such as sputtering, CVD and the like. Preferably, the blocking film is first coated on the substrate in precursor fluid form, e.g. organic silicon liquid compound such as silazanes, alcohol solutions of alcoxysilane, or other suitable liquid compound comprising silicon oxide. A spinner may be used for this coating. Alternatively, screen press printing technique, spraying technique or other coating methods may be used. The precursor film is then heated and transformed into a solid silicon oxide film. Anyway, the use of such a liquid precursor face makes it possible to form a smooth and level surface of the ion blocking film. The thickness of the precursor film is 50–2500 Å.

Referring now to FIGS. 4(A) to 4(D), a method of manufacturing a glass substrate for liquid crystal displays is described. An ion blocking film 103 made of non-doped silicon oxide is formed on the surface of a soda-lime glass 101. The use of the liquid precursor as explained supra is desirable not only to producing a smooth flat surface but also to dispense with the step of polishing the upper surface of the glass substrate. The thickness of the blocking film is 200 Å.

Figure 4A:
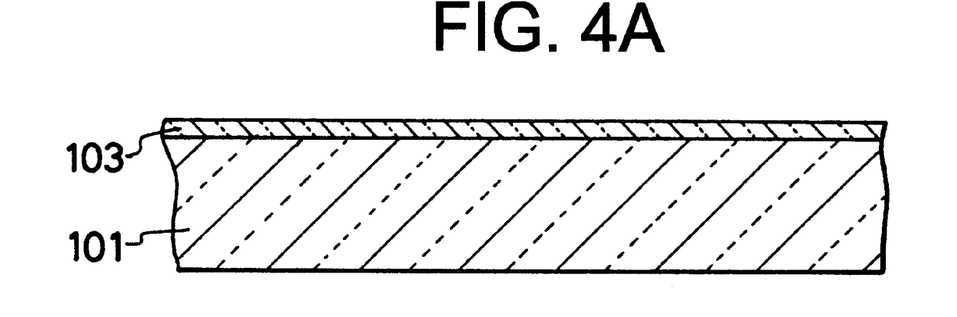
FIGS. 4(A) to 4(D) are cross sectional views showing the fabricating process of a glass substrate bearing a thin film pattern suitable for liquid crystal displays in accordance with the present invention.
Figure 4B:
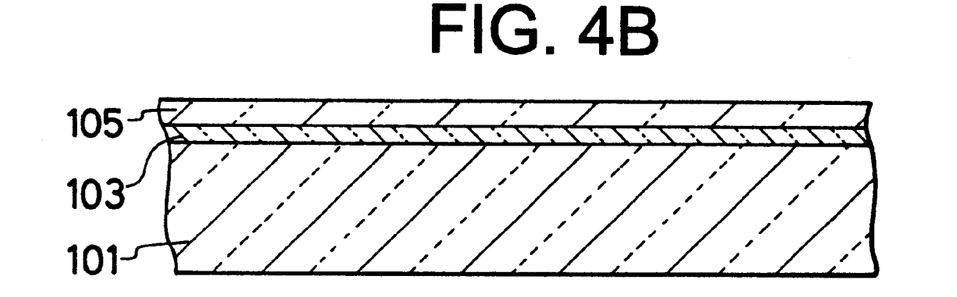
Figure 4C:
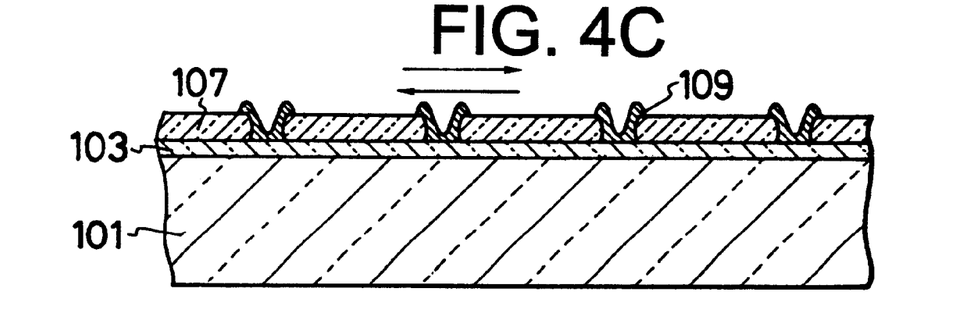
Figure 4D:
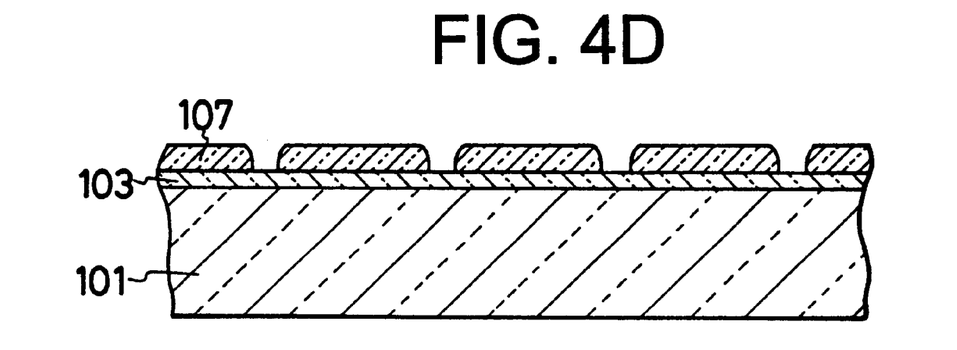

An ITO film 105 is deposited by sputtering to a thickness of 0.1 to 2 microns. As shown in FIG. 1 a train of laser pulses are emitted from an eximer laser and projected on the ITO film 105, while the substrate 101 is slided with the holder 10 in the lateral direction of FIG. 6(B). The pulse projection and the sliding of the substrate 101 are synchronously performed in order that the projections occur at intervals of 390 microns respective to the irradiated ITO film 103. The surface of the ITO film is scanned three times. Accordingly, the power of the laser pulse is selected to eliminate the ITO film throughout the thickness by three times projection without causing substantial damage to the underlying blocking film 103. Although grooves can be formed only by a single projection of the laser pulse, the use of a plurality of projections is preferred in order to precisely control the effect of the laser scribing and improved the configuration of the pattern. Finally, residue 107 by the sides of the grooves is eliminated by diluted HF etch as illustrated in FIG. 4(D).

Figure 5A:
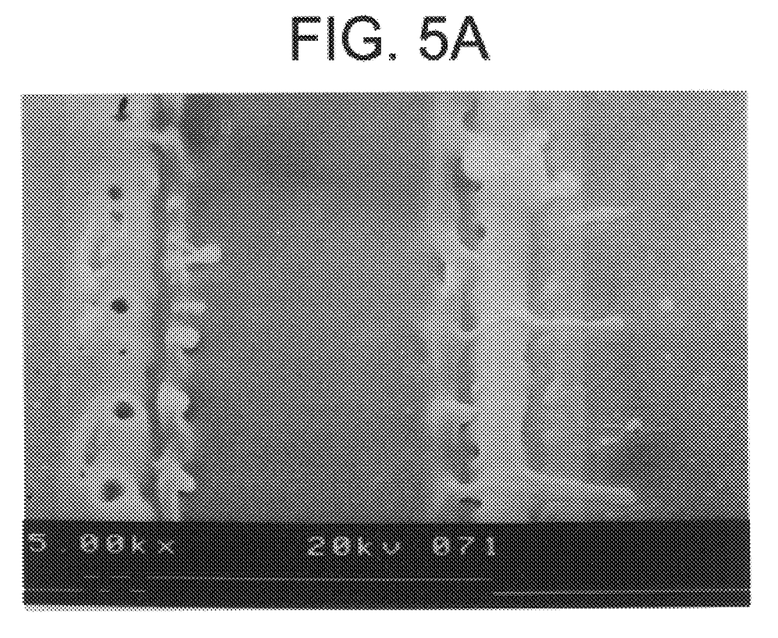
FIGS. 5(A) and 5(B) are microscopic photographs showing the configurations of grooves formed by laser scribing.
Figure 5B:
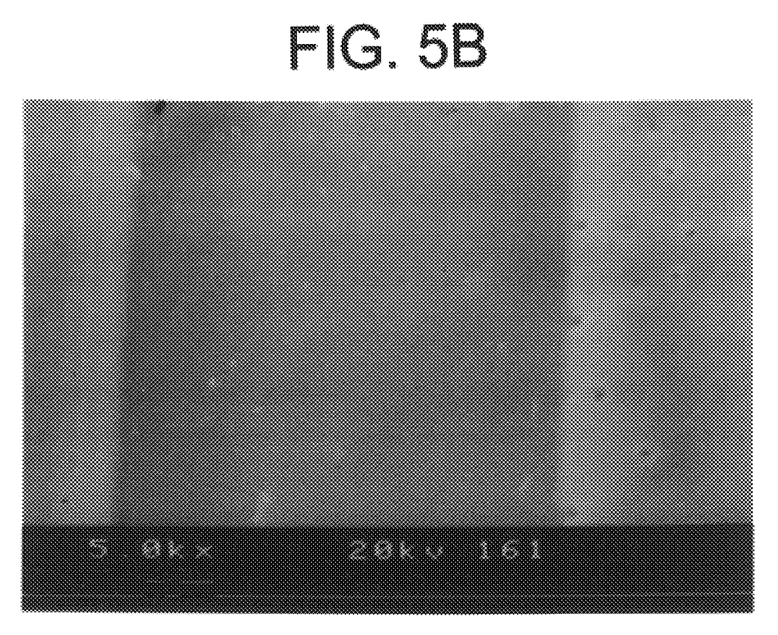
Figure 6A:
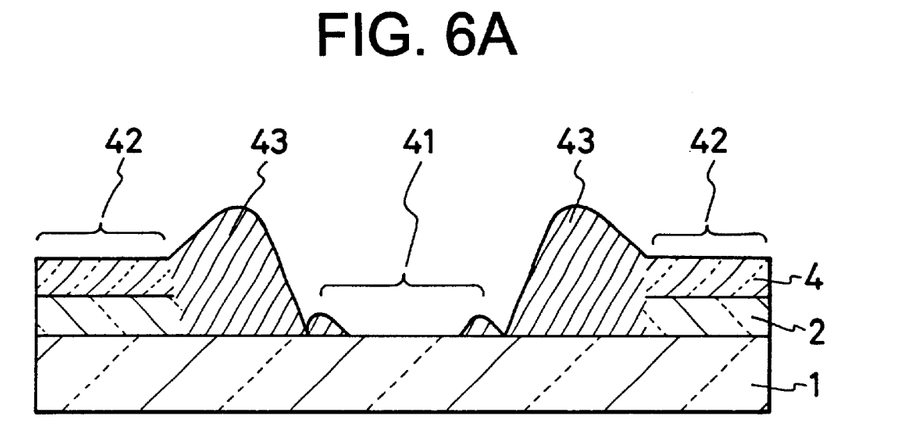
FIGS. 6(A) and 6(B) are schematic cross sectional views in accordance with the configuration shown in FIGS. 5(A) and 5(B).
Figure 6B:
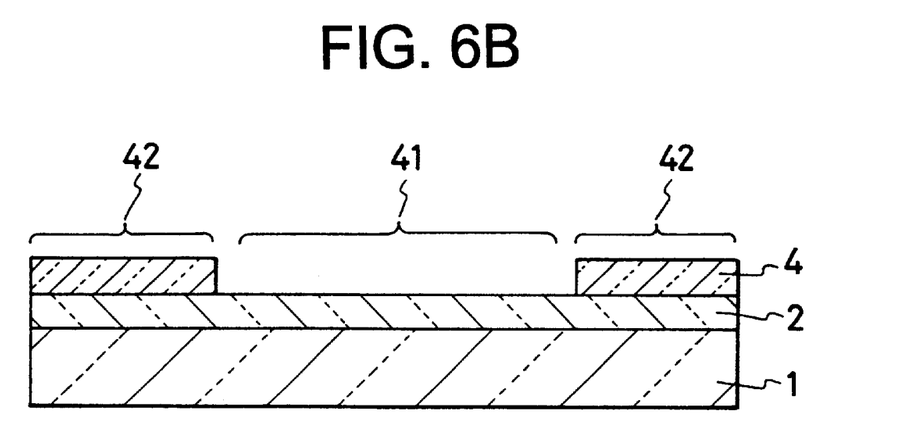

FIG. 5(B) is a microscopic photograph of a groove which was formed in a ITO film insulated from a glass substrate by an intervening silicon oxide blocking film in accordance with the present invention. The silicon oxide film was formed with few impurity ions, FIG. 6(B) is a schematic diagram illustrating the cross sectional view of the structure as shown in FIG. 5(B). As seen from the figures, the boundary of the groove was very clear and little residue remained.

FIG. 5(A) is a microscopic photograph of a groove of an ITO film which was formed on a glass substrate with an intervening photophorus doped $SiO_2$ film. FIG. 6(A) is a schematic diagram illustrating the cross sectional view of the structure as shown in FIG. 5(A). Since the melting point of the silicon oxide film became low due to the doping of phosphorous ions, the silicon oxide film was molten during the formation of the groove and formed swollen portions by the sides of the groove. The swollen portion was formed with the mixture of silicon oxide and ITO and the elimination thereof was difficult. The glass substrate was exposed through the groove.

From FIGS. 5(A), 5(B), 6(A) and 6(B), it is understood that the impurity doping is undesirable and the purity of the silicon oxide is important.

Current leakage was examined by applying a direct voltage of 50 V across each groove. This examination was carried out across 100 grooves and having 30 cm length and 10 microns width. As a result, all the leakage currents were within the range of $1\times10^{-9}$ A to $2\times10^{-9}$ A. This experiment was repeated in case with a phosphorous-doped $SiO_2$ film in place of the non-doped $SiO_2$ blocking film. As a result, a little current leakage was observed.

The laser system disclosed in the present invention can be utilized also for annealing semiconductors. A second embodiment of the present invention will be described in conjunction with FIGS. 7(A) to 7(D) and FIG. 8. FIGS. 7(A) to 7(D) show a method for manufacturing thin film transistors for an electro-optical device such as an active matrix liquid crystal device. In this embodiment, the same laser system used in the first embodiment is employed for crystallizing semiconductor islands.

Figure 7A:
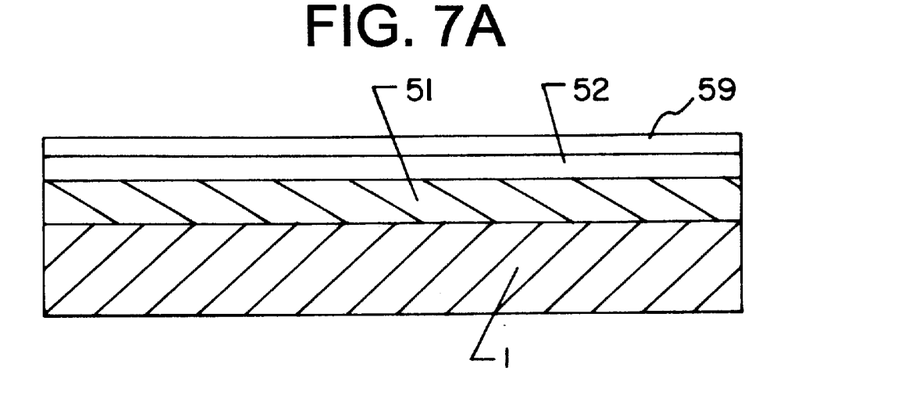
FIGS. 7(A) to 7(D) illustrate a method for manufacturing thin film transistors for an electro-optical device such as an active matrix liquid crystal device.

As shown in FIG. 7(A), a non-single crystalline semiconductor film 52 such as an amorphous silicone or solid phase crystallized silicon is formed by plasma CVD on a soda-lime glass substrate 1 having a silicon oxide or silicon nitride blocking layer 51 having a thickness of 1000–4000 Å, e.g, 2000 Å on its surface. The non-single crystalline semiconductor layer 52 is substantially intrinsic but a suitable dopant species such as boron or arsenic may be added therein. Optionally, hydrogen or a halogen such as fluorine may be added to the semiconductor layer 52 as a dangling bond neutralizer. Also, the semiconductor layer 52 is 200–1500 Å thick, for example, 500 Å. Further, the semiconductor layer is covered by an insulating layer 59 made of silicon oxide or silicon nitride and having a thickness of 200–1500 Å.

Figure 7B:
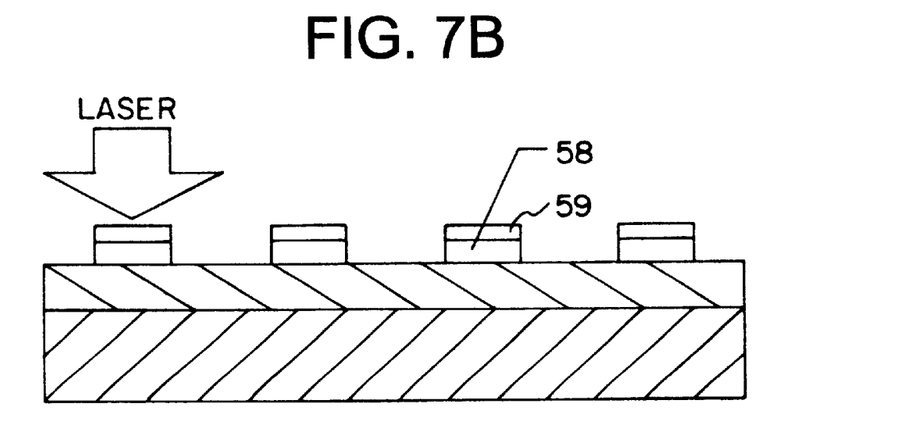
Figure 8:
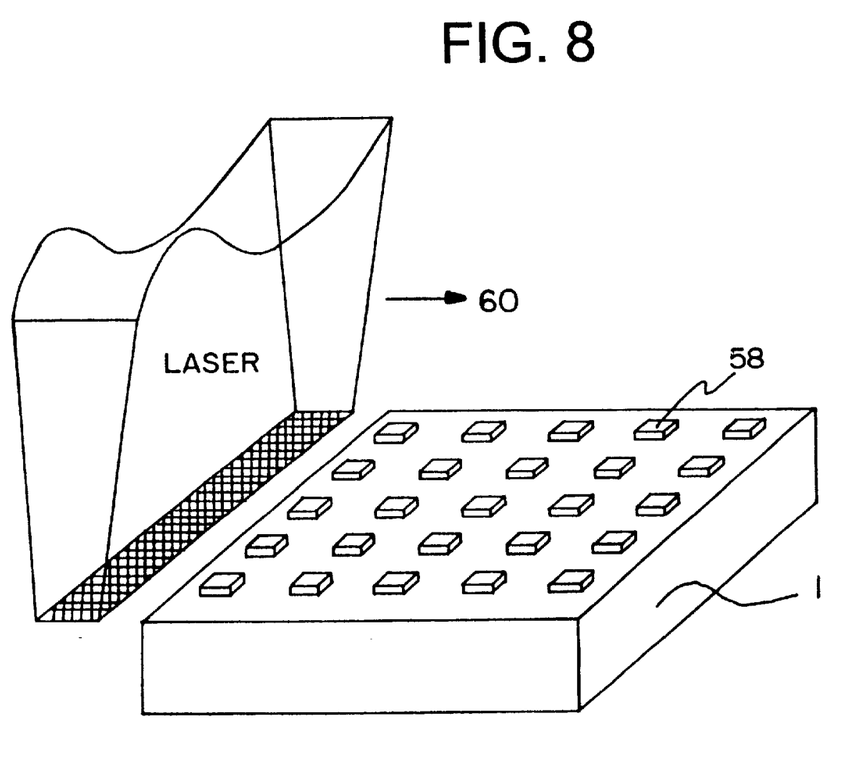
FIG. 8 illustrates the semiconductor islands covered by the insulating layer as fabricated, for example, by the method step of FIG. 7(B).

Referring to FIG., 7(B), the semiconductor layer 52 and the insulating layer 59 are simultaneously patterned by a suitable etching method in order to form a plurality of semiconductor islands 58 covered by the insulating layer. The islands are arranged in rows and columns as shown in FIG. 8. For clarification, only 5×5 islands are shown in FIG. 8. However, in practice, 480×640 or 960×1920 mislands may be formed on one substrate. It is also possible to form other semiconductor islands on the same substrate in order to form a driver circuit or peripheral circuit for driving the pixel TFTs.

Subsequently, a laser crystallization in accordance with the present invention is performed to the patterned semiconductor layer. As explained in the first embodiment of the present invention the laser beam finally emitted from the laser system shown in FIG. 1 has a line shape. The width of the line shaped laser beam corresponds to the width of the semiconductor island 58. Alternately, the width of the line shaped laser beam may be slightly larger than the width of the semiconductor island. The energy density of the laser beam is 0.3–0.5 $J/cm^2$. The wavelength and the pulse width of the laser beam is, respectively, 248.6 nm or 308 nm and 15 nanoseconds, for example. Thus, a plurality of semiconductor islands arranged in one column line is exposed to the laser beam at one time as shown in FIG. 7(B). The other semiconductor islands arranged in other columns are treated in the same manner by repeating the emission of the laser beam with the substrate moved in one direction as indicated by the arrow 60 in FIG. 7. Actually, either one of the laser optical system or substrate may be moved.

Figure 7C:
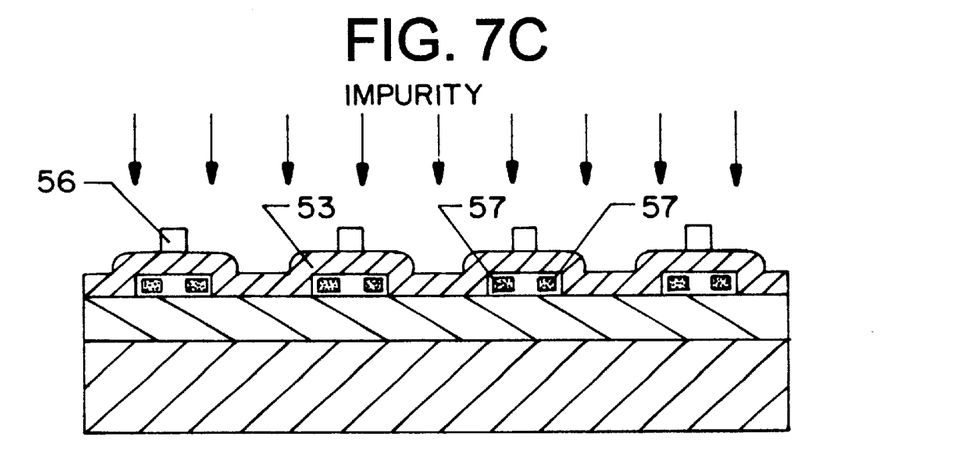

After the crystallization, the insulator 59 is etched off and another insulating layer 53 made of, for example, silicon oxide is formed on the substrate by sputtering at a thickness 500–1500 Å, for example 1100 Å as shown in FIG. 7(C). The insulating layer 53 will function as a gate insulating layer of each transistor. Further, a doped silicon layer or a metal such as aluminum or tungsten is formed at 2000–6000 Å, e.g., 3000 Å on the insulating layer 53 and patterned to form a gate electrode 56 on each island. Using the gate electrode 56 as a mask, a dopant species such as boron, phosphorous or arsenic is selectively doped into each semiconductor island 58 using the gate electrode 56 as a mask. Thereby, source and drain regions 57 are formed in each semiconductor island.

Figure 7D:
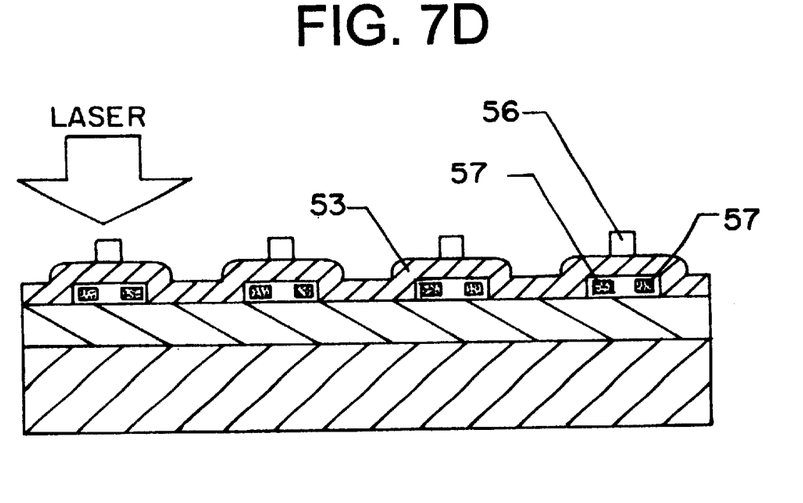

Referring to FIG. 7(D), a laser crystallization in accordance with the present invention is again performed in a similar manner as the first laser annealing explained in conjunction with FIG. 7(B). As a result, only the source and drain regions are selectively crystallized by laser annealing. At the same time, the impurity added to the source and drain regions are activated to be p or n-type.

Although omitted from the figure, an interlayer is formed over the gate electrode and contact hole(s) for source, drain and gate electrode is opened, and a second interconnector layer is formed based on the designer's experiment.

As a result, an active matrix circuit for driving a liquid crystal device is produced.

While several embodiments have been specifically described, it is to be appreciated that the present invention is not limited to the particular examples described and that modifications and variations can be made without departure from the scope of the invention as defined by the append claims. Examples are as follows.

Insulating films constituting a color filter may be integrally formed under or over the transparent conductive film.

Although the conductive film is made of a transparent conductive material such as ITO, $SiO_2$ or ZnO film, a thin film of a metal such as chromium or molybdenum can be used in the same manner.

Although in accordance with the preferred embodiment, the grooves are narrow as compared with the remaining transparent conductive film, narrow strips of 20 microns width may be left between removed portion of 400 microns width by making use of a train of pulses which are continuously projected while the substrate is gradually moved.

What is claimed is:

1. A method of manufacturing an electro-optical device having an active matrix circuit and a driving circuit, said method comprising:

forming a semiconductor film on an insulating surface of a substrate;

preparing a first pulsed excimer laser beam;

expanding said first pulsed excimer laser beam only in a first direction;

condensing the expanded pulsed excimer laser beam only in a second direction perpendicular to said first direction, thus obtaining a modified pulsed excimer laser beam;

irradiating the semiconductor film with the modified excimer laser beam wherein said laser beam has a line shaped cross section at said substrate, said line shaped cross section being elongated in said first direction;

moving said substrate with respect to said laser beam in a direction perpendicular to said first direction whereby the semiconductor film is crystallized;

forming a plurality of thin film transistors using the crystallized semiconductor film as at least channel regions of the thin film transistors, whereby both of said active matrix circuit and said driving circuit are constituted with said thin film transistors.

2. A method according to claim 1 wherein said electro-optical device is a liquid crystal device.

3. A method according to claim 1 wherein a wavelength of said pulsed excimer laser beam is one of 248 nm and 308 nm.

4. A method according to claim 1 wherein said active matrix circuits have 480×680 pixels.

5. A method according to claim 1 wherein said active matrix circuits have 960×1920 pixels.

6. A method according to claim 1 wherein said semiconductor film is formed on an insulating film comprising a material selected from the group consisting of silicon oxide and silicon nitride.

7. A method according to claim 1 further comprising a step of patterning the semiconductor film into a plurality of semiconductor islands prior to the step of irradiating.

8. A method according to claim 1 wherein said semiconductor film has a thickness within a range from 200 to 1500 Å.

9. A method according to claim 1 wherein said semiconductor film contains hydrogen.

10. A method according to claim 1 further comprising a step of forming an interlayer insulating film over said thin film transistors.

11. A method according to claim 1 wherein an energy density of said laser beam is not lower than 0.3 J/cm$^2$ and not higher than 0.5 J/cm$^2$.

12. A method of manufacturing an electro-optical device having an active matrix circuit and a driving circuit, said method comprising:

forming a semiconductor film comprising solid phase crystallized silicon on an insulating surface of a substrate;

preparing a first pulsed excimer laser beam;

expanding said first pulsed excimer laser beam only in a first direction;

condensing the expanded pulsed excimer laser beam only in a second direction perpendicular to said first direction, thus obtaining a modified pulsed excimer laser beam;

irradiating the semiconductor film with the modified pulsed excimer laser beam wherein said laser beam has a line shaped cross section at said substrate, said line shaped cross section being elongated in said first direction;

moving said substrate with respect to said laser beam in a direction perpendicular to said first direction whereby the semiconductor film is crystallized;

forming a plurality of thin film transistors using the crystallized semiconductor film as at least channel regions of the thin film transistors, whereby both of said active matrix circuit and said driving circuit are constituted with said thin film transistors.

13. A method according to claim 12 wherein said electro-optical device is a liquid crystal device.

14. A method according to claim 12 wherein a wavelength of said pulsed excimer laser beam is one of 248 nm and 308 nm.

15. A method according to claim 12 wherein said active matrix circuits have 480×680 pixels.

16. A method according to claim 12 wherein said active matrix circuits have 960×1920 pixels.

17. A method according to claim 12 wherein said semiconductor film is formed on an insulating film comprising a material selected from the group consisting of silicon oxide and silicon nitride.

18. A method according to claim 12 further comprising a step of patterning the semiconductor film into a plurality of semiconductor islands prior to the step of irradiating.

19. A method of manufacturing an electro-optical device having an active matrix circuit and a driving circuit, said method comprising:

forming a semiconductor film comprising amorphous silicon on an insulating surface of a substrate wherein said semiconductor film is doped with a dopant impurity;

preparing a first pulsed excimer laser beam;

expanding said first pulsed excimer laser beam only in a first direction;

condensing the expanded pulsed excimer laser beam only in a second direction perpendicular to said first direction, thus obtaining a modified pulsed excimer laser beam;

irradiating the semiconductor film with the modified pulsed excimer laser beam wherein said laser beam has a line shaped cross section at said substrate, said line shaped cross section being elongated in said first direction;

moving said substrate with respect to said laser beam in a direction perpendicular to said first direction whereby the semiconductor film is crystallized;

forming a plurality of thin film transistors using the crystallized semiconductor film as at least channel regions of the thin film transistors, whereby both of said active matrix circuit and said driving circuit are constituted with said thin film transistors.

20. A method according to claim 19 wherein said electro-optical device is a liquid crystal device.

21. A method according to claim 19 wherein a wavelength of said pulsed excimer laser beam is one of 248 nm and 308 nm.

22. A method according to claim 19 wherein said active matrix circuits have 480×680 pixels.

23. A method according to claim 19 wherein said active matrix circuits have 960×1920 pixels.

24. A method according to claim 19 wherein said semiconductor film is formed on an insulating film comprising a material selected from the group consisting of silicon oxide and silicon nitride.

25. A method according to claim 19 further comprising a step of patterning the semiconductor film into a plurality of semiconductor islands prior to the step of irradiating.

26. A method according to claim 19 wherein said dopant impurity is selected from the group consisting of boron and arsenic.

27. A method of manufacturing an electro-optical device having an active matrix circuit and a driving circuit, said method comprising:

forming a plurality of semiconductor islands on a blocking film, each of the semiconductor islands comprising crystallized silicon;

forming a gate insulating film on said plurality of semiconductor islands;

forming gate electrodes over said semiconductor islands with the gate insulating film interposed therebetween;

introducing an impurity into portions of the semiconductor islands with the gate electrodes used as masks, thereby forming a plurality of thin film transistors of said active matrix circuit and said driving circuit, wherein the formation of said plurality of semiconductor islands comprises a step of:

preparing a first pulsed excimer laser beam;

expanding said first pulsed excimer laser beam only in a first direction;

condensing the expanded pulsed excimer laser beam only in a second direction perpendicular to said first direction, thus obtaining a modified pulsed excimer laser beam;

directing the modified pulsed excimer laser beam to said substrate while moving the substrate in a direction orthogonal to said first direction, wherein the modified pulsed excimer laser beam has an elongated cross section elongated in the first direction.

28. A method according to claim 27 wherein said blocking film comprises a material selected from the group consisting of silicon oxide and silicon nitride.

29. A method according to claim 27 wherein said electro-optical device is a liquid crystal device.

30. A method according to claim 27 wherein a wavelength of said pulsed excimer laser beam is one of 248 nm and 308 nm.

31. A method according to claim 27 wherein said active matrix circuits have 480×680 pixels.

32. A method according to claim 27 wherein said active matrix circuits have 960×1920 pixels.

33. A method of manufacturing an electro-optical device having an active matrix circuit and a driving circuit, said method comprising:

forming a plurality of semiconductor islands on a blocking film, each of the semiconductor islands comprising crystallized silicon and doped with a dopant impurity;

forming a gate insulating film on said plurality of semiconductor islands;

forming gate electrodes over said semiconductor islands with the gate insulating film interposed therebetween;

introducing an impurity into portions of the semiconductor islands with the gate electrodes used as masks, thereby forming a plurality of thin film transistors of said active matrix circuit and said driving circuit, wherein the formation of said plurality of semiconductor islands comprises a step of:

preparing a first pulsed excimer laser beam;

expanding said first pulsed excimer laser beam only in a first direction;

condensing the expanded pulsed excimer laser beam only in a second direction perpendicular to said first direction, thus obtaining a modified pulsed excimer laser beam;

directing the modified pulsed excimer laser beam to said substrate while moving the substrate in a direction orthogonal to said first direction, wherein the pulsed excimer laser beam has an elongated cross section elongated in the first direction.

34. A method according to claim 33 wherein said blocking film comprises a material selected from the group consisting of silicon oxide and silicon nitride.

35. A method according to claim 33 wherein said electro-optical device is a liquid crystal device.

36. A method according to claim 33 wherein a wavelength of said pulsed excimer laser beam is one of 248 nm and 308 nm.

37. A method according to claim 33 wherein said active matrix circuits have 480×680 pixels.

38. A method according to claim 33 wherein said active matrix circuits have 960×1920 pixels.

39. A method according to claim 34 wherein said dopant impurity is selected from the group consisting of boron and arsenic.

40. A method of manufacturing an electro-optical device comprising the steps of:

forming a plurality of semiconductor islands on an insulating surface of a substrate wherein said semiconductor islands are arranged in a form of a matrix having rows and columns;

selectively introducing ions of an impurity into said plurality of semiconductor islands in order to form impurity regions in said semiconductor islands;

preparing a first pulsed excimer laser beam;

expanding said first pulsed excimer laser beam only in a first direction;

condensing the expanded pulsed excimer laser beam only in a second direction perpendicular to said first direction, thus obtaining a modified pulsed excimer laser beam;

activating said impurity regions in said plurality of semiconductor islands by irradiating the modified pulsed excimer laser beam having an irradiation area on said substrate, wherein said irradiation area is elongated in said first direction along one of a row direction and a column direction of said matrix;

moving said substrate in a direction along the other one of the row and column directions while irradiating the modified pulsed excimer laser beam.

* * * * *